United States Patent [19]

Verbeek

[11] Patent Number: 5,017,889

[45] Date of Patent: May 21, 1991

[54] DIGITAL PHASE-LOCKED LOOP USING A TAPPED DELAY LINE IN A PHASE METER

[75] Inventor: Robert J. M. Verbeek, Hilversum, Netherlands

[73] Assignee: AT&T Bell Laboratories, Murray Hill, N.J.

[21] Appl. No.: 534,904

[22] Filed: Jun. 8, 1990

[30] Foreign Application Priority Data

Jun. 15, 1989 [NL] Netherlands ................. 8901514

[51] Int. Cl.⁵ ............................................. H03L 7/085
[52] U.S. Cl. ..................................... 331/1 A; 331/14; 331/17; 331/25
[58] Field of Search ............. 331/1 A, 14, 17, 25; 358/17–20

[56] References Cited

U.S. PATENT DOCUMENTS 4,224,575  9/1980  Mosley et al. ................. 331/23 X
4,543,600  9/1985  Bolger ............................ 358/13

Primary Examiner—Siegfried H. Grimm

[57] ABSTRACT

A digital Phase-Locked Loop (PLL), comprising a voltage-controlled oscillator (VCO) and a phase meter including a delay line with taps, wherein phase measurements are effected by sending a pulse through the delay line and determining the location of this pulse in the delay line at the rate of the output signal of the VCO. This location is determined by a processing circuit connected to the taps, which circuit generates in response to the location found a VCO control signal corresponding therewith.

4 Claims, 2 Drawing Sheets

DIGITAL PHASE-LOCKED LOOP USING A TAPPED DELAY LINE IN A PHASE METER

The invention relates to a digital Phase-Locked Loop (PLL), comprising a voltage-controlled oscillator (VCO) and a phase meter including a delay line with taps.

Such a digital PLL is known from the U.S. Pat. No. 4,543,600. The PLL described in this Patent is designed for use in television receivers and receives an analog sinusoidal carrier which is sampled in an analog-to-digital converter and converted into a digital signal. The PLL is to be synchronized with this signal.

In order to be in a position for sampling, the A/D converter receives a sampling signal at a sampling rate. This sampling signal consists of a series of pulses generated by the VCO. In order to realise the phase measurement this sampling signal is applied to the A/D converter via the delay line, at each consecutive pulse the sampling signal being tapped from a next tap on the delay line. Consequently, the video signal is sampled with slightly progressive sampling intervals. The result is that a large number of samplings are effected in the proximity of, for example, a zero-crossing (actually a number of successive zero-crossings). By counting the number of amplitude samples having values between two given boundaries, a very accurate phase measurement is performed. This is necessary for detecting the chrominance signal in television receivers in which a phase deviation of more than two degrees in the colour subcarrier of the chrominance signal is already intolerable.

Such a PLL has a drawback that the signal received by the PLL with which the PLL is to synchronize, in this case the subcarrier, is to be periodic over a number of periods (for example eight). If this is not the case, the said count will misrepresent the phase condition so that an erroneous phase measurement is performed.

It is an object of the invention to provide a digital PLL suitable for received signals which are not successively periodic for some time.

Thereto, the digital PLL according to the invention is characterized in that the phase meter comprises a pulse generator for generating a pulse in response to a level change in the signal with which the PLL is to synchronize, an output of which pulse generator being connected to an input of the delay line, in that the phase meter further includes a processing circuit connected to the taps and to the signal output of the VCO for determining the location of the pulse in the delay line and for generating a control signal for the VCO in response to the determined location and in that the control output of the processing circuit is coupled to the control input of the VCO.

By allowing the pulse generator to generate the pulse in response to the level change in the received signal, the PLL is also suitable for non-periodic signals. The operation of the PLL according to the invention is different from the operation of the PLL from the above United States Patent. The phase in this Patent being measured by sampling various cycles of the received signal once or twice per cycle shifted in phase each time, in the PLL according to the invention the phase is measured by generating a pulse during a single cycle of the received signal which pulse is subsequently passed through the delay line, and by determining the location of the pulse in the delay line in the rhythm of the VCO frequency. This location is a measure for the phase difference between the signal generated by the VCO and the signal received by the PLL, so that the control signal for the VCO can be derived therefrom. In the above United States Patent it being a matter of devoloping a smaller phase difference in the PLL than a preset value, in the PLL according to the invention, alternatively, the frequency difference is made smaller than a preset value. This is effected by having the phase difference assume a constant value, so that the phase difference need not be made smaller than a preset value.

In an embodiment of the digital PLL according to the invention in which the delay line is formed by series-arranged delay elements of which the inputs and outputs form the taps, the digital PLL is characterized in that the pulse generator is formed by series-arranged delay elements the last of which being connected to a first input of an Exclusive Or element (ExOr) and the first of which being connected to a second input of the ExOr, the second input forming the signal input to the pulse generator, in that the output of the ExOr also constitutes the output of the pulse generator and in that the series-arranged delay elements are of the same type as those of the delay line.

By realising both the delay line and the pulse generator with the same delay elements it is not precluded, however, that a large variation occurs in the delay per delay element as a result of a variation in properties of the materials; but the pulse image in the delay line will nevertheless always show the same length because the ratio of the pulse duration to the overall delay of the delay line becomes virtually constant when using the same delay elements.

In a further embodiment the digital PLL according to the invention is characterized in that all delay elements are manufactured in $A_{III}B_V$ technology where $A_{III}$ is an element from the third column and $B_V$ is an element from the fifth column of the periodic system of elements.

When using these delay elements (for example manufactured of Gallium Arsenide) the PLL becomes suitable for very high-frequency signals to be received (of the order of 1 to 2 GHz) because of the favourable high-frequency properties of these materials.

An embodiment of the digital PLL according to the invention is characterized in that the processing circuit comprises a gate circuit having an AND function, whose first and second inputs are connected to taps located at the ends of the delay line, whose third input is connected to a tap located in the middle of the delay line and whose output is connected to a signal source for generating the control signal setting the VCO to its nominal frequency. If a pulse of a normal pulse duration is not located in the middle of the delay line, the signals at the former two taps each have a different logic value.

If the pulse had a different pulse duration and was located in the middle of the delay line as a result of disturbing influences, such as, for example, if the circuit in integrated form were constituted by temperature gradients on an integration surface, it will be detected by the gate circuit. A first gate circuit arranged for detecting too wide a pulse produces a signal with a logic value "one" if signals with the logic values "one" are available at the three said taps. A second gate circuit arranged for detecting too narrow a pulse produces a signal with a logic value "one" if signals with the logic value "zero" are available at the former two taps, whilst a signal with the logic value "one" is available at the third tap. In this case the inverse values of the former two taps are applied to the gate circuit having the AND function. By combining the two gate circuits, each pulse having a different pulse duration is detected in response to which the signal source generates the control signal setting the VCO to its nominal frequency, worded differently, the control signal as a result of which the VCO is not pulled.

The invention will be further explained with reference to an embodiment represented in the drawing Figures, in which.

Figure 1:
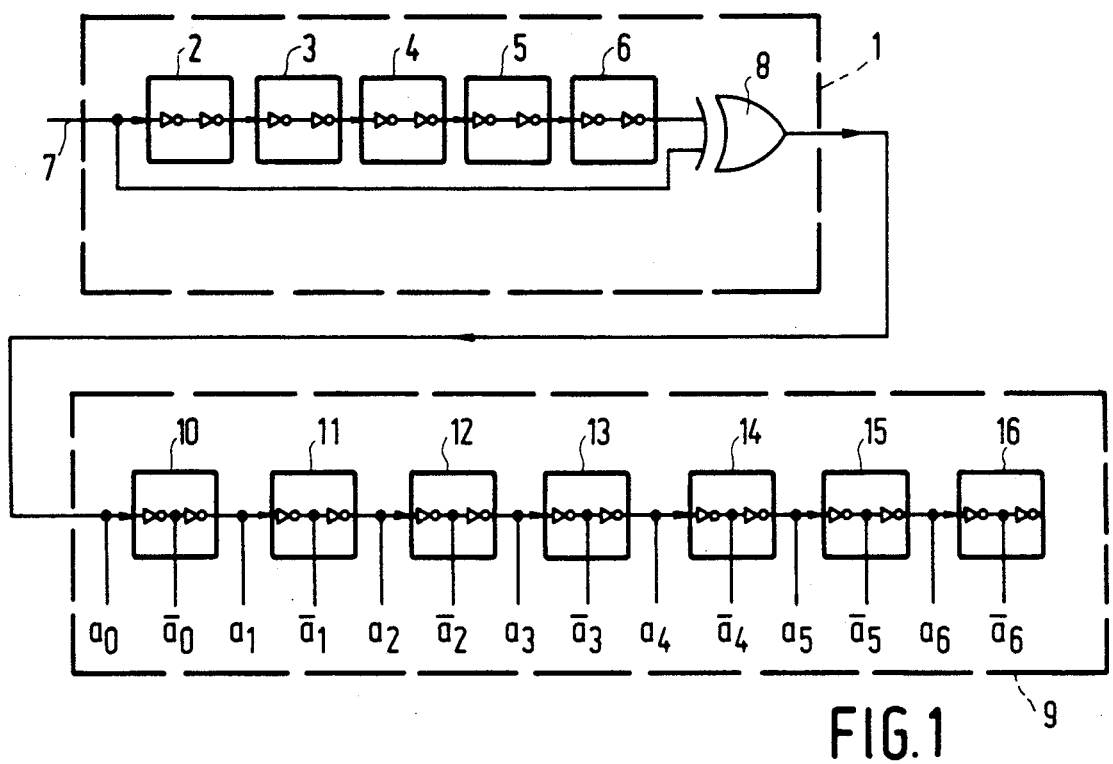
FIG. 1 shows a block diagram of the pulse generator and the delay line suitable for use in the digital PLL according to the invention.

The pulse generator represented in FIG. 1 comprises five series-arranged delay elements 2 to 6 transferring the change of the signal level at input 7 to a first input of the ExOr 8. The second input of this ExOr 8 is directly connected to the input 7 of the pulse generator 1. Input 7 also forms the input to the digital PLL to which the signal is applied with which the PLL is to synchronize.

The delay line 9 represented in FIG. 1 comprises seven series-arranged delay elements 10 to 16. The first delay element 10 is connected to the output of pulse generator 1 (this is the output of ExOr 8).

Each of the delay elements 2 to 6 and 10 to 16 comprises two series-arranged inverters, for example, realised in Gallium Arsenide (GaAs). The input to the first inverter of each delay element 10 to 16 of the delay line 9 forms the first tap of this delay element. The junction between the two inverters forms a second tap supplying the inverse value of the first tap. Thus, the delay element 10 provides the taps $a_0$ and $\bar{a}_0$, delay element 11 the taps $a_1$ and $\bar{a}_1$ and so on, up to delay element 16 with taps $a_6$ and $\bar{a}_6$.

A signal at an inverse tap $\bar{a}_i$ appears one inverter period later than the associated non-inverted signal at $a_i$. If so desired, this difference in time can be compensated for by arranging in series with the tap $a_1$ a buffer having the same delay, which is not represented in FIG. 1.

Figure 2:
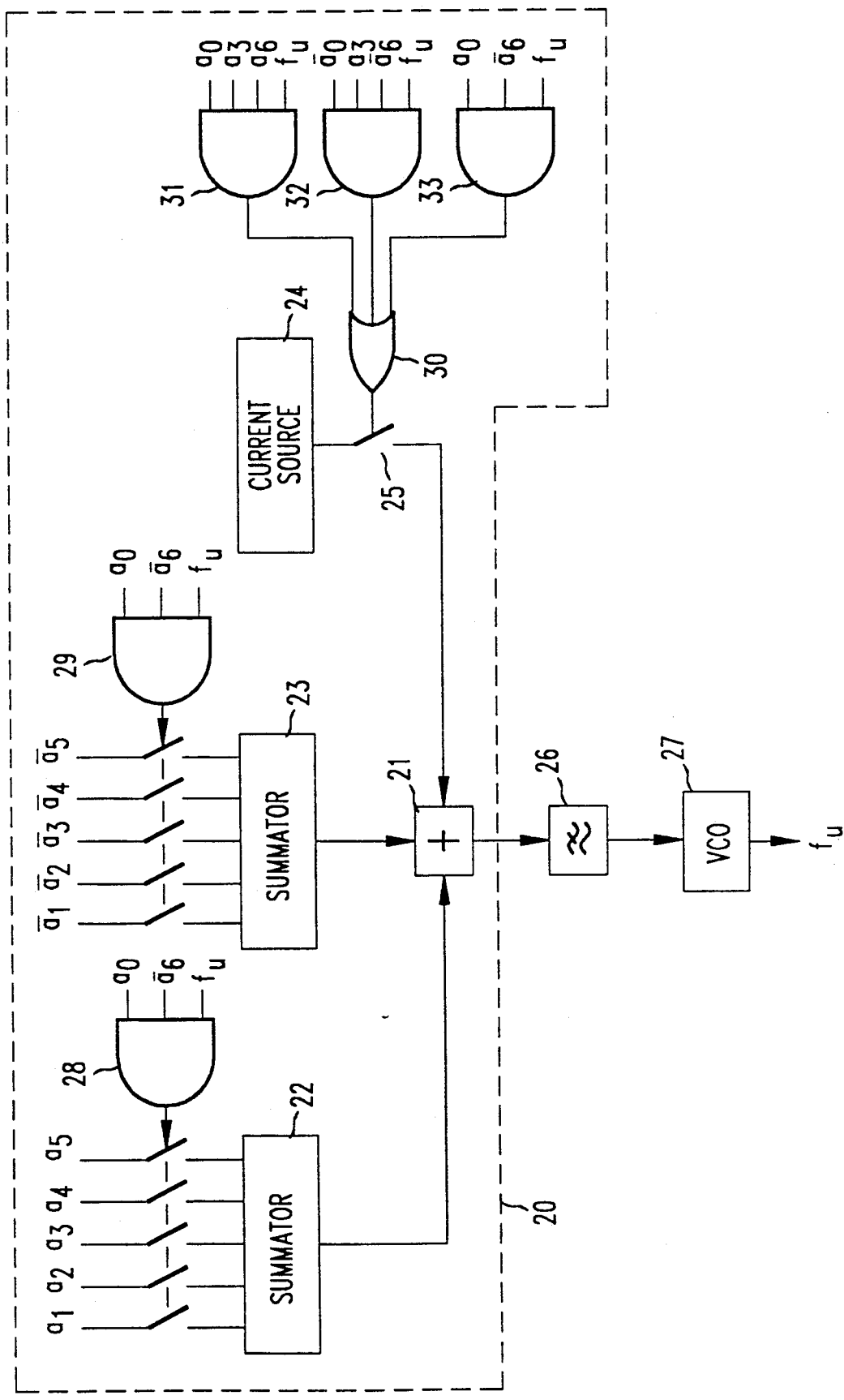
FIG. 2 shows a block diagram of the processing circuit, a low-pass filter and the VCO suitable for use in the digital PLL according to the invention.

The processing circuit 20 represented in FIG. 2 is connected to the taps of delay line 9. Processing circuit 20 comprises an adder 21 connected to the outputs of summators 22 and 23 and the output of current source 24 through switch 25. Thus, this adder 21 is used for adding up the values supplied by these three outputs. The result of this addition forms the control signal applied to the control input of VCO 27 via the control output of the processing circuit 20 (this is the output of adder 21) and low-pass filter 26.

Summator 22 comprises five inputs which are each connected to one of the taps $a_1$, $a_2$, $a_3$, $a_4$ and $a_5$ by means of switches controlled by AND gate 28. The three inputs of AND gate 28 are connected to tap $\bar{a}_0$, tap $a_6$ and to the output $f_u$ of VCO 27. If both $\bar{a}_0$ and $a_6$ and $f_u$ have the logic value "one", the output of AND gate 28 also assumes the logic value "one" and the associated switches are closed.

Summator 23 has five inputs which are connected each to one of the taps $\bar{a}_1$, $\bar{a}_2$, $\bar{a}_3$, $\bar{a}_4$ and $\bar{a}_5$ by means of switches controlled by AND gate 29. The three inputs of AND gate 29 are connected to tap $a_0$, tap $\bar{a}_6$ and $f_u$. If both $a_0$ and $\bar{a}_6$ and $f_u$ have the logic value "one", the output of AND gate 29 also has the logic value "one" and the associated switches are closed.

Current source 24 is connected to adder 21 by means of the switch 25 controlled by the OR gate 30. OR gate 30 closes switch 25 if at least one of the three inputs of OR gate 30 has the logic value "one". A first input of this OR gate is connected to the output of AND gate 31, which is connected to $a_0$, $a_3$, $a_6$ and $f_u$. A second input of OR gate 30 is connected to the output of AND gate 32, which is connected to $\bar{a}_0$, $\bar{a}_3$, $\bar{a}_6$ and $f_u$. A third input of OR gate 30 is connected to the output of AND gate 33, which is connected to $a_0$, $\bar{a}_6$ and $f_u$.

Current source 24 generates at its output a signal having weight 5, that is to say, current source 24 generates the same signal as summator 22 if $a_1$ to $a_5$ have the logic value "one" (and, naturally, $\bar{a}_0$, $a_6$ and $f_u$ also have the logic value "one").

The operation of the digital PLL is explained with reference to the Table 1 represented hereinbelow. It shows:

situation 1 to 11; the operation with a normal pulse width of 5D, where D is the delay of one delay element;

situations 12 and 13; the operation with too wide a pulse (of 6D)

situation 14; the operation with too wide a pulse of 7D and situations 15 and 16; the operation with too narrow a pulse of 4D.

TABLE I

| | $a_0$ | $a_1$ | $a_2$ | $a_3$ | $a_4$ | $a_5$ | $a_6$ | output summator 22 | output summator 23 | output current source 24 | output adder 21 |
|---|---|---|---|---|---|---|---|---|---|---|---|
| (1) | 0 | 0 | 0 | 0 | 0 | 0 | 1 | 0 | 0 | 0 | 0 |
| (2) | 0 | 0 | 0 | 0 | 0 | 1 | 1 | 1 | 0 | 0 | 1 |
| (3) | 0 | 0 | 0 | 0 | 1 | 1 | 1 | 2 | 0 | 0 | 2 |
| (4) | 0 | 0 | 0 | 1 | 1 | 1 | 1 | 3 | 0 | 0 | 3 |
| (5) | 0 | 0 | 1 | 1 | 1 | 1 | 1 | 4 | 0 | 0 | 4 |
| (6) | 0 | 1 | 1 | 1 | 1 | 1 | 0 | 0 | 0 | 5 | 5 |
| (7) | 1 | 1 | 1 | 1 | 1 | 0 | 0 | 0 | 1 | 5 | 6 |
| (8) | 1 | 1 | 1 | 1 | 0 | 0 | 0 | 0 | 2 | 5 | 7 |
| (9) | 1 | 1 | 1 | 0 | 0 | 0 | 0 | 0 | 3 | 5 | 8 |
| (10) | 1 | 1 | 0 | 0 | 0 | 0 | 0 | 0 | 4 | 5 | 9 |
| (11) | 1 | 0 | 0 | 0 | 0 | 0 | 0 | 0 | 5 | 5 | 10 |
| (12) | 1 | 1 | 1 | 1 | 1 | 1 | 0 | 0 | 0 | 5 | 5 |
| (13) | 0 | 1 | 1 | 1 | 1 | 1 | 1 | 5 | 0 | 0 | 5 |
| (14) | 1 | 1 | 1 | 1 | 1 | 1 | 1 | 0 | 0 | 5 | 5 |
| (15) | 0 | 1 | 1 | 1 | 1 | 0 | 0 | 0 | 0 | 5 | 5 |

TABLE I-continued

|  | $a_0$ | $a_1$ | $a_2$ | $a_3$ | $a_4$ | $a_5$ | $a_6$ | output summator 22 | output summator 23 | output current source 24 | output adder 21 |
|---|---|---|---|---|---|---|---|---|---|---|---|
| (16) | 0 | 0 | 1 | 1 | 1 | 1 | 0 | 0 | 0 | 5 | 5 |

Under normal circumstances pulse generator 1 will generate a pulse having a pulse duration of 5D in response to a change in the level of the received signal, provided that no subsequent level change occurs within this pulse duration. This pulse then passes through the delay line 9 and fits in it completely so that the delay of delay line 9 is 7D.

If the frequency $f_u$ of the signal generated by VCO 27 is too low, the phase will lag and the pulse will be located to the right of the middle of the delay line 9. This is represented in Table 1 by the situations 1 to 5. In situation 1 the pulse is rightmost so that no more than one fifth of the pulse is located in delay line 9. The rest of the pulse has already completely passed through the delay line 9. Consequently, $a_0$ to $a_5$ assume the value "zero" and $a_6$ the value "one". AND gate 28 generates the value "one" so that $a_1$ to $a_5$, all having the value "zero", are applied to summator 22. The latter adds up its input values and applies the sum (in this case the value "zero") to the adder 21, which applies this signal to the control input of VCO 27 in response to which the latter enhances the frequency $f_u$.

In situation 5 the pulse is located slightly to the right of the middle. Then $a_0$ and $a_1$ have the value "zero" and $a_2$ to $a_6$ the value "one". AND gate 28 generates the value "one" in response to which $a_1$ to $a_5$ are applied to summator 22. The latter applies the sum (in this case the value of four) to adder 21, which applies this signal having the value of four to the control input of VCO 27, in response to which the latter slightly enhances the frequency $f_u$.

In situation 6 the pulse is exactly in the middle of the delay line 9. Then $a_0$ and $a_6$ have the value "zero" and $a_1$ to $a_5$ the value "one". AND gate 32 in this case generates the value "one" in response to which OR gate 30 generates the value "one" and switch 25 is closed. The signal having the value of five originating from current source 24 is applied to adder 21 conveying this signal to VCO 27.

In response to the signal having the value of five VCO 27 maintains the frequency $f_u$.

In situation 7 the pulse is located slightly to the left of the middle of delay line 9. The frequency $f_u$ is then slightly too high and the phase leads. When this happens, $a_0$ to $a_4$ have the value "one" and $a_5$ and $a_6$ the value "zero". AND gate 29 produces a signal with a value "one" in response to which $\overline{a}_1$ to $\overline{a}_5$ are applied to summator 23. The latter then applies a signal with the value "one" (only $\overline{a}_5$ has the value "one") to adder 29. Because AND gate 33 and hence also OR gate 30 produce signals with the value "one", switch 25 is closed and adder 21 receives from current source 24 a signal with the value of five. Adder 21 adds up the signals supplied and applies a sum signal with a value of six to VCO 27, which slightly reduces the frequency $f_u$ in response thereto.

In situation 11 the pulse is located leftmost. In this situation $a_0$ has the value "one" and $a_1$ to $a_6$ have the value "zero". AND gate 29 generates a signal having the value "one", in response to which $\overline{a}_1$ to $\overline{a}_5$ are applied to summator 23 which consequently applies a signal having the value of five to adder 21. Simultaneously, switch 25 is closed and current source 24 applies a signal having the value of five to adder 21, so that AND gate 33 and hence also OR gate 30 produce a signal having the value "one". Adder 21 adds up the two received signals and applies a signal having the value of ten to VCO 27, which reduces frequency $f_u$ in response thereto.

Similar explanations refer to the situations not described. The more to the left or right the pulse is located, the more the VCO 27 is pulled to a signal having a lower or higher frequency $f_u$ respectively. If the pulse is located exactly in the middle, frequency $f_u$ is maintained.

If the circuit is realised in an integrated form, it is possible for the pulse to become wider (situations 12, 13 and 14) or narrower (situations 15 and 16), for example, as a result of temperature gradients on an integrating surface.

In situations 12 and 13 the pulse has a duration of 6D and is located slightly to the left ($a_0$ to $a_5$ have the value "one", $a_6$ the value "zero") or slightly to the right respectively ($a_0$ has the value "zero", $a_1$ to $a_6$ have the value "one"). If this pulse is located slightly to the left, adder 21 receives a signal having the value of five from the current source 24, in the other case from the summator 22. In these two cases VCO 27 receives the adding signal having a value of five and the frequency $f_u$ is maintained.

In situation 14 the pulse has a duration of 7D and $a_0$ to $a_6$ have a value "one". Adder 21 receives from current source 24 the signal having the value of five, in response to which VCO 27 maintains frequency $f_u$.

In situations 15 and 16 the pulse has a duration of 4D. In the first case $a_0$, $a_5$ and $a_6$ have the value "zero" and $a_1$ to $a_4$ the value "one". In the second case $a_0$, $a_1$ and $a_6$ have the value "zero" and $a_2$ to $a_5$ the value "one". In both cases AND gate 32 applies a signal having the value "one" to OR gate 30, in response to which switch 25 is closed and the signal having the value of five is applied from the current source 24 to the adder 21. In response thereto VCO 27 maintains the frequency $f_u$.

Figure 3:
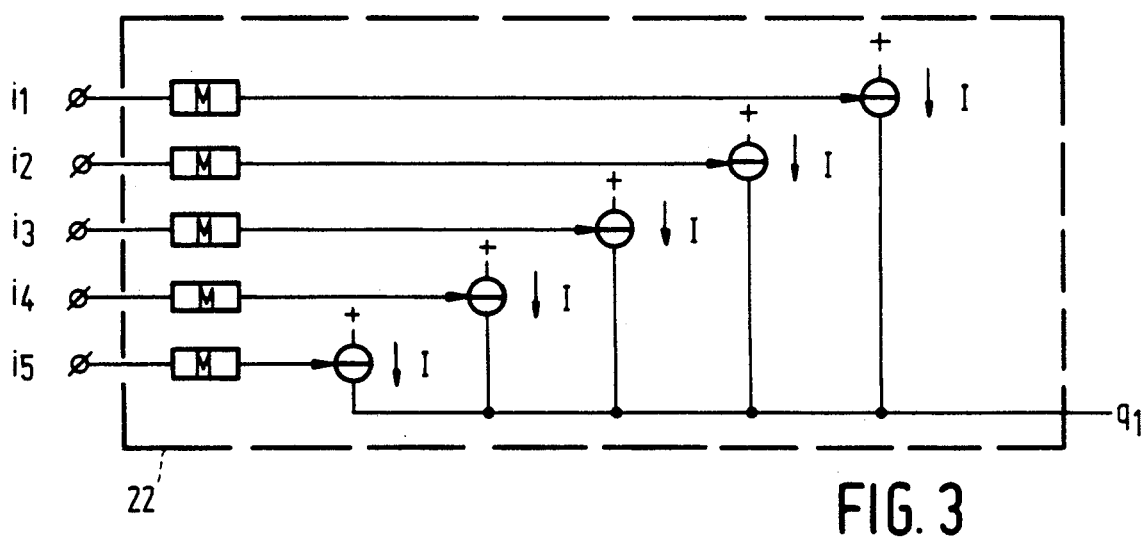
FIG. 3 shows a summator from the processing circuit.

The summator 22 represented in FIG. 3 has five inputs $i_1$, $i_2$, $i_3$, $i_4$ and $i_5$. In the case of summator 22 these inputs are coupled to taps $a_1$ to $a_5$. In the case of summator 23 these inputs are coupled to inverse taps $\overline{a}_1$ to $\overline{a}_5$. In the sequel the same holds for summator 23 as for summator 22. Each input of summator 22 is connected via a memory M to the control input of a controlled source generating or not generating a current I in response to a control signal. All sources are arranged in parallel with their outputs. The five parallel-arranged outputs together form the output $q_1$ of summator 22, which output $q_1$ is connected to adder 21. Depending on the logic values of the signals available at the inputs $i_1$ to $i_5$, a current with a value between "zero" and 5I is generated by summator 22 at output $q_1$, whilst I is the current that can be generated by a single controlled source.

Figure 4:
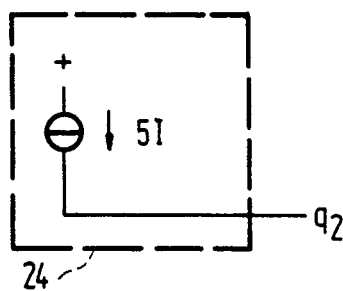
FIG. 4 shows a current source from the processing circuit.

The current source 24 represented in FIG. 4 generates a current having a value of 5I, thus having a value which is five times as large as the value of the current which is generated by a controlled source from summator 22. Output $q_2$ of current source 24 is coupled to adder 21 by means of switch 25.

Since both the summator 22 and the current source 24 generate signals in the form of currents through the respective outputs $q_1$ and $q_2$, adder 21 can be realised in a simple manner as a resistor. One side of this resistor is then connected to a reference potential and the other side is connected to the outputs of summator 22 and current source 24. The currents generated by them cause a voltage to occur across the resistor, which voltage is supplied to VCO 27 through low-pass filter 26.

I claim:

1. Digital Phase-Locked Loop (PLL), comprising a voltagecontrolled oscillator (VCO) and a phase meter including a delay line with taps, characterized in that the phase meter comprises a pulse generator for generating a pulse in response to a level change in the signal with which the PLL is to synchronize, an output of which pulse generator being connected to an input of the delay line, in that the phase meter further includes a processing circuit connected to the taps and to the signal output of the VCO for determining the location of the pulse in the delay line and for generating a control signal for the VCO in response to the determined location and in that the control output of the processing circuit is coupled to the control input of the VCO.

2. Digital PLL as claimed in claim 1, in which the delay line is formed by series-arranged delay elements whose inputs and outputs form the taps, characterized in that the pulse generator is formed by series-arranged delay elements the last of which being connected to a first input of an EXCLUSIVE OR element (ExOr) and the first of which being connected to a second input of the ExOr, the second input forming the signal input to the pulse generator, in that the output of the ExOr also constitutes the output of the pulse generator and in that the series-arranged delay elements are of the same type as those of the delay line.

3. Digital PLL as claimed in claim 2, characterized in that all delay elements are manufactured in $A_{III} B_V$ technology where $A_{III}$ is an element from the third column and $B_V$ is an element from the fifth column of the periodic system of elements.

4. Digital PLL as claimed in claim 1, 2 or 3, characterized in that the processing circuit comprises a gate circuit having an AND function whose first and second inputs are connected to taps located at the ends of the delay line, whose third input is connected to a tap located in the middle of the delay line and whose output is connected to a signal source for generating the control signal setting the VCO to its nominal frequency.

* * * * *